(12) United States Patent
Luan et al.

(10) Patent No.: US 11,538,786 B2
(45) Date of Patent: Dec. 27, 2022

(54) TRANSFER PRINTING METHOD AND TRANSFER PRINTING APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Xinglong Luan, Beijing (CN); Jing Feng, Beijing (CN); Fuqiang Li, Beijing (CN); Zhichong Wang, Beijing (CN); Peng Liu, Beijing (CN); Wusheng Li, Beijing (CN); Chunjing Liu, Beijing (CN)

(73) Assignees: ORDOS YUANSHENG OPTOELECTRONICS CO., LTD., Inner Mongolia (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 130 days.

(21) Appl. No.: 16/649,801

(22) PCT Filed: Mar. 19, 2019

(86) PCT No.: PCT/CN2019/078731
§ 371 (c)(1),
(2) Date: Mar. 23, 2020

(87) PCT Pub. No.: WO2020/186456
PCT Pub. Date: Sep. 24, 2020

(65) Prior Publication Data
US 2021/0225679 A1  Jul. 22, 2021

(51) Int. Cl.
*H01L 23/00*  (2006.01)
*H01L 21/67*  (2006.01)
(Continued)

(52) U.S. Cl.
CPC .......... *H01L 24/95* (2013.01); *G02B 26/0833* (2013.01); *H01L 21/67132* (2013.01);
(Continued)

(58) Field of Classification Search
CPC ........... H01S 3/10; H01S 3/101; G02B 26/00; G02B 26/08; G02B 26/0816;
(Continued)

(56) References Cited

U.S. PATENT DOCUMENTS 7,127,810 B2 * 10/2006 Kasuga .............. B23K 26/0608
250/548
10,153,325 B2  12/2018  Thothadr et al.
(Continued)

FOREIGN PATENT DOCUMENTS

CN    101859714    10/2010
CN    109326549    2/2012
(Continued)

*Primary Examiner* — Eduardo A Rodela
(74) *Attorney, Agent, or Firm* — Leason Ellis LLP (57) ABSTRACT

A transfer printing method and a transfer printing apparatus. The transfer method includes: transferring a plurality of devices formed on an original substrate to a transfer substrate; obtaining first position information of positions of the plurality of devices on the transfer substrate; obtaining second position information of corresponding positions, on a target substrate, of devices to be transferred; comparing the first position information with the second position information to obtain first target position information recording a first transfer position; and aligning the transfer substrate with the target substrate and performing a site-designated laser irradiation on at least part of devices on the transfer substrate corresponding to the first transfer position, simultaneously, according to the first target position information, so as to transfer the at least part of the devices from the transfer substrate to the target substrate.

17 Claims, 8 Drawing Sheets

(51) Int. Cl.
*H01L 21/68* (2006.01)
*H01L 33/00* (2010.01)
*H01S 3/10* (2006.01)
*G02B 26/08* (2006.01)
*H01L 25/075* (2006.01)

(52) U.S. Cl.
CPC .. *H01L 21/67144* (2013.01); *H01L 21/67253* (2013.01); *H01L 21/67294* (2013.01); *H01L 21/681* (2013.01); *H01L 24/06* (2013.01); *H01L 24/799* (2013.01); *H01L 25/0753* (2013.01); *H01L 33/005* (2013.01); *H01S 3/10* (2013.01); *H01L 2221/68363* (2013.01); *H01L 2224/03001* (2013.01); *H01L 2933/0033* (2013.01)

(58) Field of Classification Search
CPC ............ G02B 26/0833; G02B 26/0988; H01L 21/681; H01L 21/67132; H01L 21/67253; H01L 21/67294; H01L 33/005; H01L 2221/68363; H01L 24/01; H01L 24/02; H01L 24/03; H01L 24/04; H01L 24/06; H01L 24/95; H01L 24/97; H01L 27/3237; H01L 33/48; H01L 33/486; H01L 33/62
See application file for complete search history.

(56) References Cited

U.S. PATENT DOCUMENTS

| | | | | |
|---|---|---|---|---|
| 2004/0101984 | A1* | 5/2004 | Heine | G06T 7/0004 356/237.4 |
| 2010/0259164 | A1* | 10/2010 | Oohata | H01L 25/0753 445/24 |
| 2014/0307299 | A1* | 10/2014 | Matsumoto | B23K 26/064 359/238 |
| 2017/0288087 | A1* | 10/2017 | Schubert | H01L 33/007 |
| 2017/0358623 | A1* | 12/2017 | Thothadri | H01L 33/60 |
| 2018/0114878 | A1* | 4/2018 | Danesh | H01L 33/42 |
| 2018/0374738 | A1* | 12/2018 | Lee | H01L 24/75 |
| 2018/0374987 | A1* | 12/2018 | Zou | H01L 25/0753 |
| 2019/0006564 | A1* | 1/2019 | Sasaki | H01L 21/6835 |
| 2019/0025970 | A1* | 1/2019 | Kim | H01L 27/323 |
| 2019/0035817 | A1* | 1/2019 | Park | H01L 27/124 |
| 2019/0058080 | A1* | 2/2019 | Ahmed | H01L 33/005 |

FOREIGN PATENT DOCUMENTS

| | | |
|---|---|---|
| CN | 109196424 | 1/2019 |
| CN | 109449100 | 3/2019 |
| WO | 2013010113 | 1/2013 |

\* cited by examiner

TRANSFER PRINTING METHOD AND TRANSFER PRINTING APPARATUS

CROSS-REFERENCE TO RELATED PATENT APPLICATIONS

This application is a U.S. National Stage Application under 35 U.S.C. § 371 of International Patent Application No. PCT/CN2019/078731 filed on Mar. 19, 2019, which is incorporated by reference in its entirety.

TECHNICAL FIELD

At least one embodiment of the present disclosure relates to a transfer printing method and a transfer printing apparatus.

BACKGROUND

With the development of Internet of Things technology, the integration of display devices and micro/nano devices has become the future development trend. In the integration process of small-sized micro/nano devices and display devices, massive micro/nano devices need to be accurately transferred to designated positions of the display devices.

SUMMARY

At least one embodiment of the present disclosure provides a transfer printing method and a transfer printing apparatus.

At least one embodiment of the present disclosure provides a transfer printing method, including: transferring a plurality of devices formed on an original substrate to a transfer substrate; obtaining first position information of positions of the plurality of devices on the transfer substrate; obtaining second position information of corresponding positions, on a target substrate, of devices to be transferred; comparing the first position information with the second position information to obtain first target position information recording a first transfer position; and aligning the transfer substrate with the target substrate, and performing a site-designated laser irradiation on at least part of devices on the transfer substrate corresponding to the first transfer position, simultaneously, according to the first target position information, so as to transfer the at least part of devices from the transfer substrate to the target substrate.

For example, the performing the site-designated laser irradiation includes: inputting the first target position information into a laser printer having a spatial light modulation component, so that the spatial light modulation component modulates the laser printer to simultaneously perform laser irradiation on the at least part of devices on the transfer substrate corresponding to the first transfer position.

For example, the comparing the first position information with the second position information to obtain the first target position information includes: if the first position information includes all positions recorded in the second position information, the first target position information is the second position information.

For example, the first position information includes all positions recorded in a plurality of the second position information; a plurality of the first target position information is the plurality of the second position information; and the transfer substrate is configured to be aligned with a plurality of the target substrates, respectively, so that the devices on the transfer substrate are transferred to the plurality of the target substrates, respectively, according to the plurality of the first target position information.

For example, the first position information includes a plurality of sub-position information, and the comparing the first position information with the second position information to obtain the first target position information includes: if first sub-position information of the plurality of sub-position information includes only part of positions recorded in the second position information, the second position information is divided into a first information region covered by the first sub-position information and a second information region including position information missed by the first sub-position information, and the first target position information is position information of the first information region.

For example, the transfer printing method further includes: comparing second sub-position information of the plurality of sub-position information with position information of the second information region to obtain second target position information recording a second transfer position, wherein if the second sub-position information includes all positions recorded in the second information region, the position information of the second information region is the second target position information; and performing a site-designated laser irradiation on at least part of devices on the transfer substrate corresponding to the second transfer position, simultaneously, according to the second target position information.

For example, the obtaining the first position information includes: performing an optical scanning on the transfer substrate to obtain position information of the plurality of devices on the transfer substrate.

For example, a turned-on time a laser pulse of the laser printer is within a turned-on time of the spatial light modulation component.

For example, the transfer substrate includes a transparent material layer and an adhesive layer which are laminated, and the plurality of devices are located on a side of the adhesive layer away from the transparent material layer.

For example, a side of the target substrate on which the plurality of devices are arranged is provided with a buffer layer, and an orthographic projection of the buffer layer on the target substrate is not overlapped with orthographic projections of the plurality of devices on the target substrate.

For example, before forming the plurality of devices, the transfer printing method includes: forming a sacrificial layer on the original substrate and patterning the sacrificial layer to form a plurality of sacrificial layer blocks spaced apart from each other; and the forming the plurality of devices includes: forming a material layer for forming the plurality of devices on a side of the plurality of sacrificial layer blocks away from the original substrate, the material layer including portions located on the plurality of sacrificial layer blocks and portions located at gaps between adjacent sacrificial layer blocks; patterning the material layer to form the plurality of devices on the plurality of sacrificial layer blocks and to form connecting sections connecting every adjacent two devices, the connecting sections including portions on the plurality of sacrificial layer blocks and portions at the gaps between adjacent sacrificial layer blocks; and removing the sacrificial layer.

For example, forming the plurality of devices includes: forming a sacrificial layer on the original substrate; and forming the plurality of devices on a side of the sacrificial layer away from the original substrate; and after forming the plurality of devices, the transfer printing method includes: patterning the sacrificial layer, so that an orthographic projection of the sacrificial layer on the original substrate is completely within orthographic projections of the plurality of devices on the original substrate.

For example, the plurality of devices are micro LEDs, and a maximum size of each of the plurality of micro LEDs in a direction parallel to the original substrate is 5-20 μm.

At least one embodiment of the present disclosure provides a transfer printing apparatus, including: a transfer substrate, configured to transfer a plurality of devices formed on an original substrate to a target substrate; and a laser printer, including a spatial light modulation component configured to modulate the laser printer according to a comparison result between first position information of the plurality of devices on the transfer substrate and second position information on the target substrate configured to receive devices to be transferred, so that the laser printer performs a site-designated laser irradiation on at least part of devices on the transfer substrate, simultaneously.

For example, the transfer printing apparatus further includes: a data processor, electrically connected to the spatial light modulation component and configured to compare the first position information with the second position information to obtain target position information to be transmitted to the spatial light modulation component, wherein the spatial light modulation component modulates the laser printer according to the target position information, so as to perform the site-designated laser irradiation on the at least part of devices located at a transfer position on the transfer substrate, simultaneously.

For example, the spatial light modulation component is a digital micromirror device.

For example, the digital micromirror device includes a plurality of micromirrors, and each of the plurality of micromirrors has a square shape and a size of 5.6 μm*5.6 μm-12 μm*12 μm in a plane parallel to the transfer substrate.

For example, the transfer printing apparatus further includes: a zoom lens located on a side of the spatial light modulation component facing the transfer substrate.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

In research, the inventors of the present application have found that: mass transfer printing (MTP) is one of the key steps in the production process of micro LED, and the related technology has attracted extensive attentions in the display panel industry. At present, the massive transfer technology includes the Micro-Transfer-Printing technology invented by X-Celeprint Ltd., the transfer printing technology by manufacturing a patterned transfer substrate, and the laser scanning technology, etc.

The Micro-Transfer-Printing technology realizes the pick-up and placement of micro/nano devices by dynamically controlling the adhesion of elastic stamp. That is, a large array of micro devices is selectively picked up and printed on a target substrate by using an elastic stamp in combination with a high-precision motion control print head. By changing the speed of the print head, the adhesion force between the elastic stamp and the devices to be printed can be selectively adjusted, and finally the assembly process is controlled. A relatively fast transfer speed can realize the pick-up of micro/nano devices, and a relatively slow transfer speed can realize the placement of micro/nano devices. That is, when the stamp moves fast, the adhesion force becomes large, and micro-nano devices can be picked up; when the stamp is away from the bonding interface and moves slowly, the adhesion force becomes very small and the micro/nano device can be released onto the target substrate. However, this technology cannot change the density of micro/nano devices and cannot place micro/nano devices according to demands.

The transfer printing technology achieved by manufacturing a patterned transfer substrate realizes the transfer and placement of micro/nano devices by means of electrostatic interaction, magnetic attraction, etc. However, in this method, patterning a transfer substrate involves a high cost and easily causes defects. In addition, although the laser scanning method can realize precise transfer of micro/nano devices, it has a low working efficiency and is not suitable for industrial production.

Embodiments of the present disclosure provide a transfer printing method and a transfer printing apparatus. The transfer printing method includes: transferring a plurality of devices formed on an original substrate to a transfer substrate; obtaining first position information of positions of the plurality of devices on the transfer substrate; obtaining second position information of corresponding positions of devices to be transferred on a target substrate; comparing the first position information with the second position information to obtain first target position information recording a first transfer position; and aligning the transfer substrate with the target substrate, and performing a site-designated laser irradiation on at least part of devices on the transfer substrate corresponding to the first transfer position, simultaneously, according to the first target position information, so as to transfer the at least part of devices from the transfer substrate to the target substrate. By adopting the transfer printing method provided by the embodiments of the present disclosure, massive micro/nano devices can be transferred to the target substrate rapidly, so that not only can the manufacturing cost be reduced, but also can the micro/nano devices be accurately placed at designated positions on the target substrate according to needs, thereby accelerating an industrialization process of a Micro-LED display panel.

The transfer printing method and the transfer printing apparatus provided by the embodiments of the present disclosure will be described below with reference to the accompanying drawings.

Figure 1A:
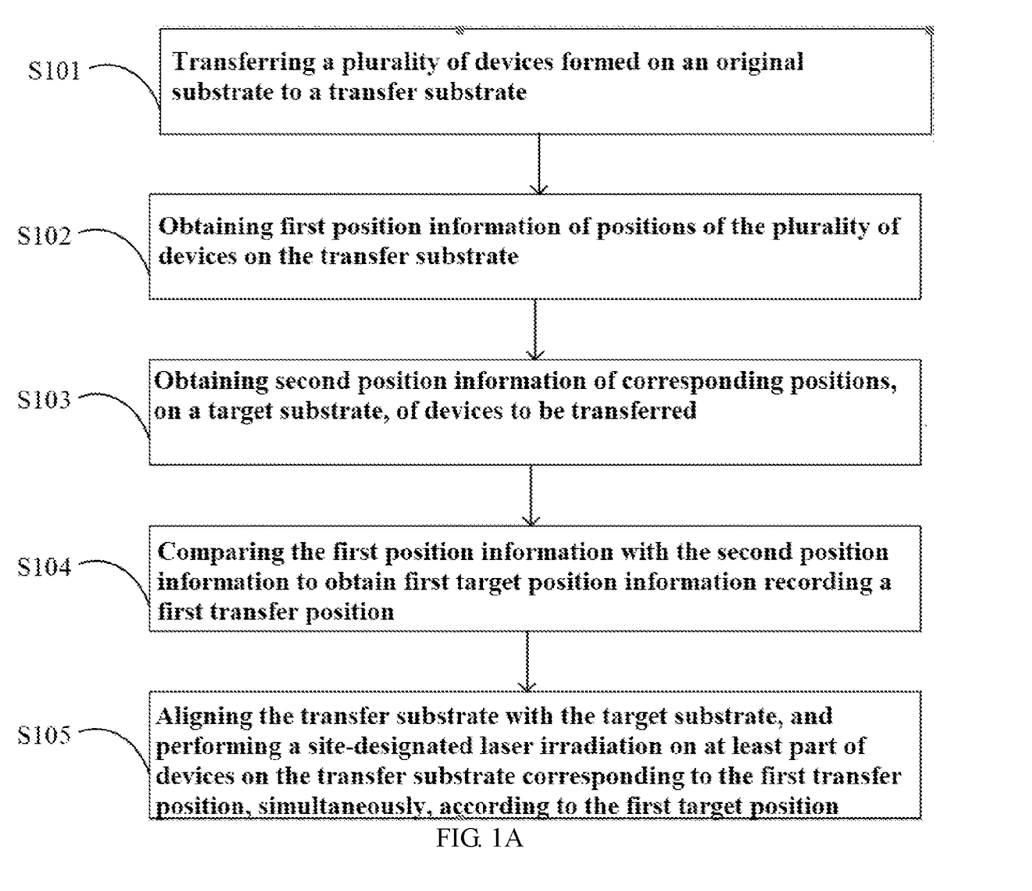
FIG. 1A is a schematic flow chart of a transfer printing method provided by an embodiment of the disclosure.
Figure 1B:
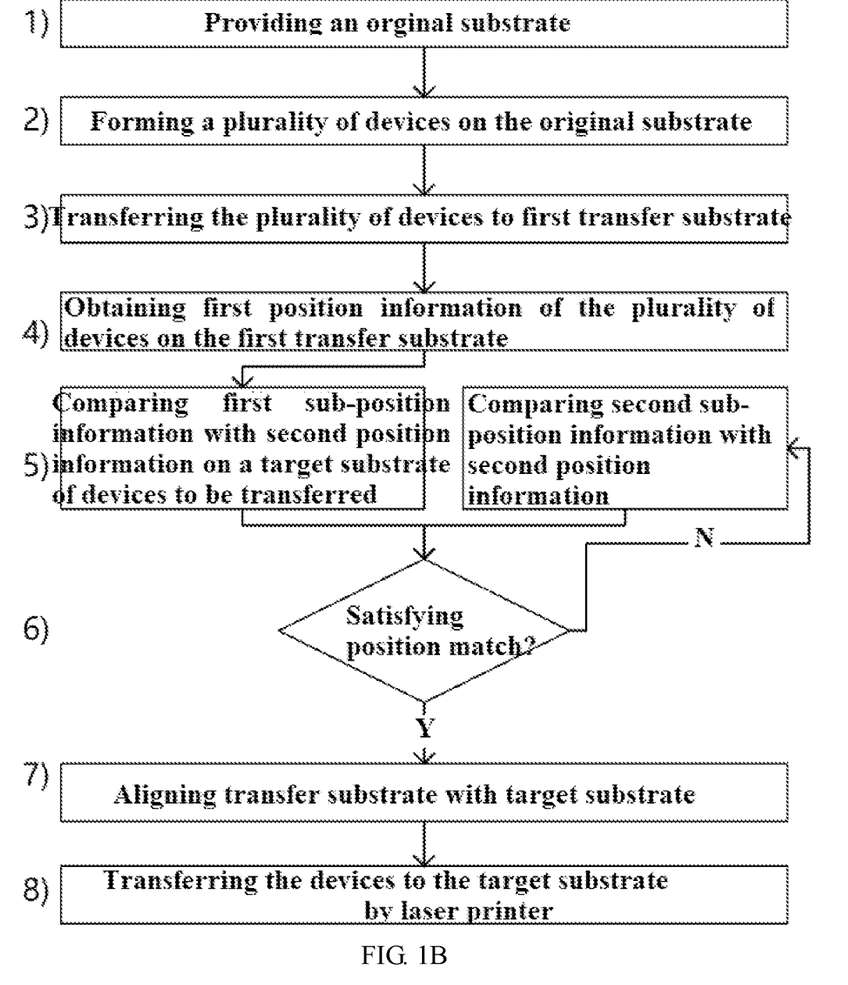
FIG. 1B is a schematic transfer printing flow chart according to the transfer printing method shown in FIG. 1A.

An embodiment of the present disclosure provides a transfer method. FIG. 1A is a schematic flow chart of a transfer method provided by the present embodiment, and FIG. 1B is a schematic transfer printing flow chart according to the transfer method shown in FIG. 1A. As shown in FIG. 1A, the transfer method includes the following specific steps.

S101: transferring a plurality of devices formed on an original substrate to a transfer substrate.

S102: obtaining first position information of positions of the plurality of devices on the transfer substrate.

S103: obtaining second position information of corresponding positions, on a target substrate, of devices to be transferred.

S104: comparing the first position information with the second position information to obtain first target position information recording a first transfer position.

S105: aligning the transfer substrate with the target substrate, and performing a site-designated laser irradiation on at least part of devices on the transfer substrate corresponding to the first transfer position, simultaneously, according to the first target position information, so as to transfer the at least part of devices from the transfer substrate to the target substrate.

Figure 2A:
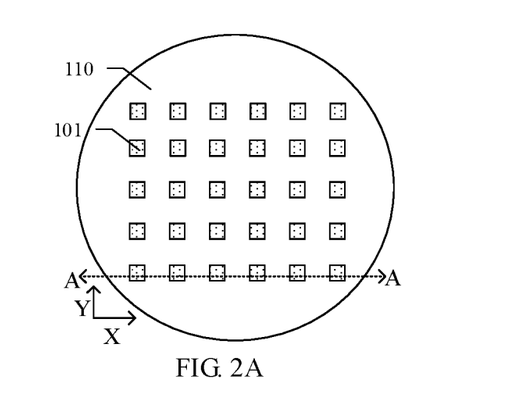
FIGS. 2A and 2B are schematic structural diagrams of devices formed on an original substrate provided by an example of an embodiment of the present disclosure.
Figure 2B:
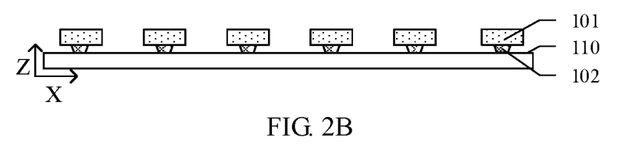

FIGS. 2A and 2B are schematic structural diagrams of devices formed on an original substrate provided by an example of the present embodiment. FIG. 2B is a schematic cross-sectional view taken along line AA shown in FIG. 2A.

For example, as shown in FIGS. 1B and 2A, an original substrate 110 is provided. The material of the original substrate 110 can be silicon, sapphire, silicon carbide, etc.

For example, the shape of the original substrate 110 may be circular, and its diameter can be 6 inches, 9 inches, 12 inches, etc. FIG. 2A illustratively shows that the shape of the original substrate is circular, but the present embodiment is not limited thereto, and the shape of the original substrate can be rectangular or other shapes.

For example, as shown in FIGS. 1B and 2A, a plurality of devices 101 are formed on the original substrate 110. For example, a material for forming the devices 101 can be formed on the original substrate 110 by means of epitaxial growth, etc., and then the plurality of devices 101 can be formed by a photolithography process.

For example, as shown in FIGS. 2A and 2B, a sacrificial layer 102 is formed on the original substrate 110 before the devices 101 are formed. After the devices 101 are formed on the sacrificial layer 102, the sacrificial layer 102 is patterned so that the sacrificial layer 102 is located only between the devices 101 and the original substrate 110, that is, an orthographic projection of the sacrificial layer 102 on the original substrate 110 is located within an orthographic projection of intermediate portions of the devices 101 on the original substrate 110. In this case, a retained portion of the sacrificial layer 102 is used to keep the devices 101 connected to the original substrate 110. After etching the sacrificial layer 102, only the portion located between the center of the bottom of the device 101 and the original substrate 110 is retained, so that the device 101 can be easily removed from the original substrate 110.

Figure 3A:
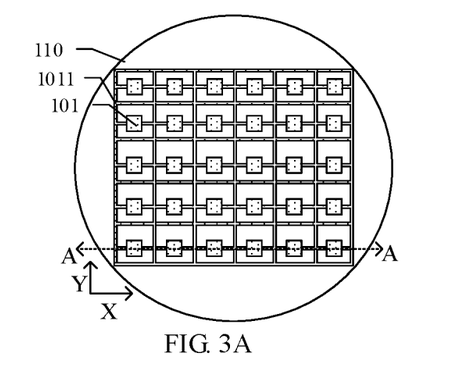
FIGS. 3A-3C are schematic structural diagrams of devices formed on an original substrate provided by another example of an embodiment of the disclosure.
Figure 3B:
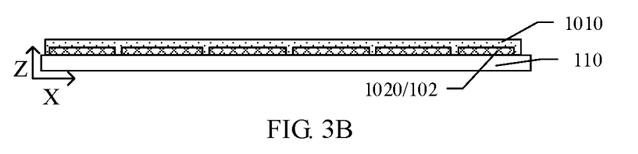
Figure 3C:
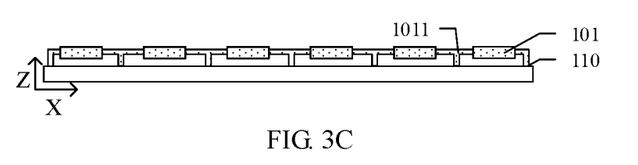

For example, FIGS. 3A-3C are schematic structural diagrams of devices formed on an original substrate provided by another example of the present embodiment. FIG. 3C is a schematic cross-sectional view taken along line AA shown in FIG. 3A. As shown in FIG. 3B, before forming the devices 101, the transfer printing method includes: forming a sacrificial layer 102 on the original substrate 110 and patterning the sacrificial layer 102 to form a plurality of sacrificial layer blocks 1020 separated from each other. There are gaps between the plurality of sacrificial layer blocks 1020 arranged in an array along an X direction and a Y direction.

For example, as shown in FIGS. 3A-3C, forming the devices 101 includes: forming a material layer 1010 for forming the devices 101 on a side of the sacrificial layer blocks 1020 away from the original substrate 110, the material layer 1010 including portions located on the sacrificial layer blocks 1020 and portions located at the gaps between adjacent sacrificial layer blocks 1020; patterning the material layer 1010 to form the devices 101 on the sacrificial layer blocks 1020 and to form connecting sections 1011 connecting every adjacent two devices 101, the connecting sections 1011 including portions located on the sacrificial layer blocks 1020 and portions located at the gaps between adjacent sacrificial layer blocks 1020; etching away the entire sacrificial layer 102, that is, etching away the entire sacrificial layer blocks 1020, so that the plurality of devices 101 are connected to the original substrate 110 through the connecting sections 1011.

For example, if the devices 101 have a poor tolerance to ultraviolet irradiation, an ultraviolet absorption layer (silicon nitride) or a reflection layer (aluminum or molybdenum, etc.) can be deposited on the surface of the material layer 1010 before the patterning process of forming the devices 101.

For example, the devices 101 in the present embodiment can be micro LEDs. For example, a maximum size of each micro LED in a direction parallel to the original substrate is 5-20 µm. The micro LEDs have a good tolerance to ultraviolet irradiation, and the formation of the ultraviolet absorption layer or the reflection layer mentioned above may be omitted. In the case where the devices 101 are micro LEDs, the material layer 1010 can include film layers such as an anode layer, a light emitting layer, a cathode layer, etc. A plurality of micro LEDs 101 can be formed by patterning the material layer 1010, while the connecting section 1011 between adjacent micro LEDs 101 has a small width so as to enable the devices 101 to be easily removed from the original substrate 110.

Figure 4A:
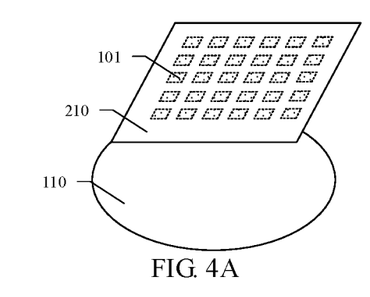
FIG. 4A is a schematic diagram of transferring devices from an original substrate to a transfer substrate according to an embodiment of the present disclosure.
Figure 4B:
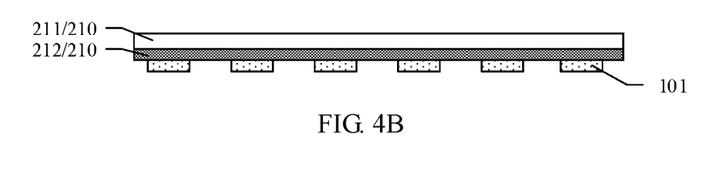
FIGS. 4B and 4C are schematic diagrams of a transfer substrate according to an embodiment of the present disclosure.
Figure 4C:
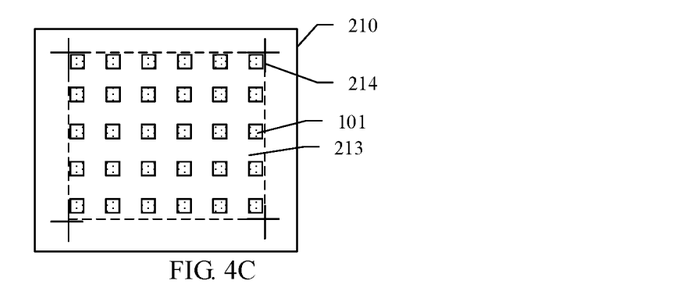

For example, FIG. 4A is a schematic diagram of transferring devices from an original substrate to a transfer substrate, FIGS. 4B and 4C are schematic diagrams of a transfer substrate provided by the present embodiment, and FIG. 4C is a schematic planar structural diagram of the transfer substrate shown in FIG. 4B.

For example, as shown in FIGS. 1B and 4A, a plurality of devices 101 are transferred onto a transfer substrate 210. Because the devices 101 are located on a side of the transfer substrate 210 facing the original substrate 110, the devices 101 on the transfer substrate 210 shown in FIG. 4A are represented by dashed boxes.

For example, as shown in FIG. 4B, the transfer substrate 210 includes a transparent material layer 211 and an adhesive layer 212, and the devices 101 are located on the adhesive layer 212.

For example, the material of the transparent material layer 211 includes a material having high transmittance to ultraviolet light, such as quartz, etc.

For example, the material of the adhesive layer 212 includes polydimethyl-siloxane (PDMS) or the like. After the transfer substrate 210 contacts with the original substrate 110, the devices 101 are transferred to the transfer substrate 210 by means of van der Waals force or electrostatic adsorption, etc.

For example, as shown in FIG. 4C, the transfer substrate 210 includes at least four alignment marks 214, and a region 213 between the alignment marks 214 is a region for transferring the devices 101. The size of the transfer substrate 210 can be adjusted according to the size of the devices 101 and the transfer efficiency. FIG. 4C illustratively shows that the alignment marks are located at four vertices of the region for transferring the devices 101, but the present embodiment is not limited thereto; the alignment marks can also be located on the edges of the region, or at the positions of the region other than the positions for transferring the devices.

Figure 5A:
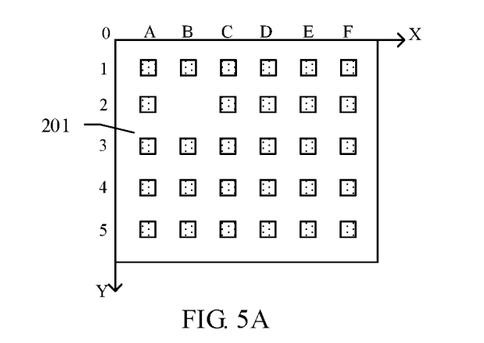
FIGS. 5A-5C are schematic diagrams of first position information, second position information and first target position information provided by an example of an embodiment of the disclosure, respectively.
Figure 5B:
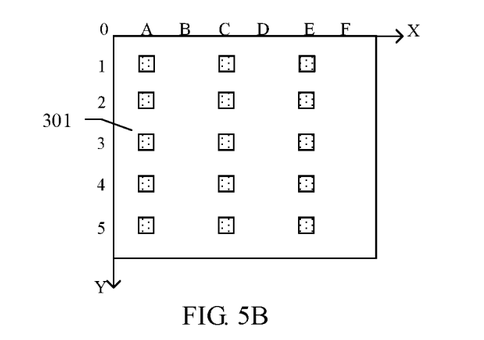
Figure 5C:
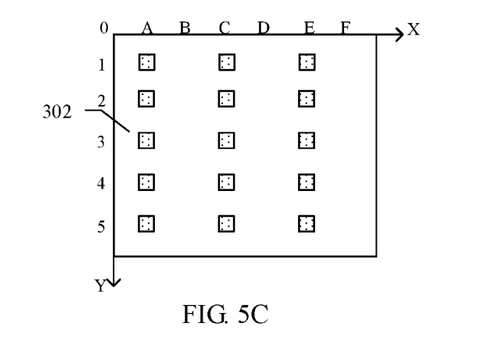

For example, FIGS. 5A-5C are schematic diagrams of first position information, second position information and first target position information provided by an example of the present embodiment.

For example, as shown in FIGS. 1B and 5A, first position information 201 of the plurality of devices 101 on the transfer substrate 210 is obtained. Obtaining the first position information 201 includes: performing an optical scanning on the transfer substrate 210 to obtain position information of the plurality of devices 101 on the transfer substrate 210. For example, an optical inspection equipment (such as automatic optical inspection equipment, AOI equipment) can be used to scan the side of the transfer substrate 210 on which the devices 101 are disposed, to determine the distribution of the devices 101 on the transfer substrate 210, and to output the first position information 201. FIG. 5A may show the whole of the first position information, or may show first sub-position information among a plurality of sub-position information included in the first position information.

For example, the first position information 201 can be a data file with a format of txt, csv, xls, doc, etc.

For example, the first position information 201 includes position information of the device 101 to be transferred to the transfer substrate 210, or the first position information 201 at least includes position information of the device 101 not to be transferred to the transfer substrate 210.

For example, as shown in FIG. 5A, a position of a device on the transfer substrate can be converted into a position of the device at a certain point in a coordinate system on the transfer substrate, and therefore, the first position information 201 is the coordinate position information of the devices. As shown in FIG. 5A, the coordinates of the first device in the first row are (1, A), the coordinates of the second device in the fifth row are (5, B), etc., and each device corresponds to one pair of coordinates.

For example, as shown in FIG. 5B, the second position information 301 can be information such as a design layout position information on the target substrate, that is, the positions recorded in the second position information 301 are positions that have been designed according to device requirements. A position on the target substrate corresponding to a device to be transferred can be converted into a position of the device at a certain point in a coordinate system on the target substrate, and therefore, the second position information 301 is the coordinate information of the devices to be transferred, and the coordinate system on the transfer substrate and the coordinate system on the target substrate are a same coordinate system. Here, "a same coordinate system" means that, when the transfer substrate is aligned with the target substrate, an orthographic projection of the coordinate system of the transfer substrate on the target substrate coincides with the coordinate system of the target substrate, and therefore, the position coordinates of a device on the transfer substrate relative to the transfer substrate are the same as the position coordinates of the device when served as a device to be transferred on the target substrate relative to the target substrate.

A coordinate position with a device in FIG. 5A is represented by a shaded square, while a coordinate position without a device (e.g., the position represented by coordinates (2, B) in FIG. 5A) is represented by a blank region, but the present embodiment is not limited thereto. It may also be that a coordinate position with a device is represented by a number "1" and a coordinate position without a device is represented by a number "0".

For example, in the evenly distributed device positions shown in FIG. 5A, the distance between two devices arranged in the direction of the X axis is half of the distance between two devices arranged in the direction of the X axis shown in FIG. 5B; while in the evenly distributed device positions shown in FIG. 5A, the distance between two devices arranged in the direction of the Y axis is equal to the distance between two devices arranged in the direction of the Y axis shown in FIG. 5B.

In the embodiment of the present disclosure, a first distance between adjacent two devices arranged in the direction of the coordinate axis in a partial region on the transfer substrate is in an integer multiple relationship with a second distance between adjacent two devices arranged in the direction of the coordinate axis in a partial region on the target substrate. That is, the first distance can be an integer multiple of the second distance, or the second distance can be an integer multiple of the first distance.

For example, as shown in FIGS. 1B and 5A-5C, comparing the first position information 201 with the second position information 301 of the devices to be transferred on the target substrate to obtain the first target position information 302 includes: if the first position information 201 includes all positions recorded in the second position information 301, the first target position information 302 is the second position information 301. That is, the first target position information 302 can be generated by comparing the first position information 201 with the second position information 301. If the position coordinates of the devices to be transferred in the second position information 301 are included in the position coordinates of the devices in the first position information 201, a device transfer is performed according to the position coordinates recorded in the second position information 301. In this case, the first target position information is information such as the design layout position information on the target substrate, and the first position information and the second position information meet a position matching requirement, so that the next step of alignment can be performed.

Figure 6A:
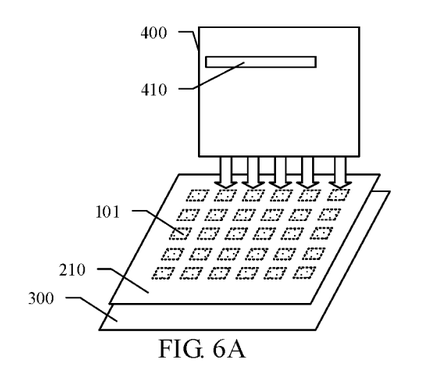
FIG. 6A is a schematic diagram of a site-designated transfer process provided by an embodiment of the disclosure.

For example, FIG. 6A is a schematic diagram of a site-designated transfer process provided by the present embodiment. As shown in FIGS. 1B and 6A, the transfer substrate 210 is aligned with the target substrate 300, and the devices 101 are transferred to the target substrate 300 by using a laser printer 400.

For example, the transfer substrate 210 can be aligned with the target substrate 300 by using the alignment marks 214 shown in FIG. 4C.

For example, the laser printer 400 performs a site-designated laser irradiation on the devices 101 on the transfer substrate 210 to transfer the devices 101 onto the target substrate 300. The site-designated laser irradiation includes: inputting, by a data processor, the first target position information 302 into the laser printer 400 having a spatial light modulation component 410, so as to control an on-off state of the spatial light modulation component 410 to enable the laser printer 400 to perform laser irradiation on at least part of the device 101 on the transfer substrate 210 corresponding to the first transfer position.

For example, the adhesive layer 212 of the transfer substrate 210 has a relatively large adhesion force (>0.1 N/cm$^2$) at a low degree of crosslinking, and has a reduced adhesion force (<0.05 N/cm$^2$) at a high degree of crosslinking; and the degree of crosslinking can be adjusted by heating or ultraviolet irradiation. The degree of crosslinking of the adhesive layer 212 after being irradiated with ultraviolet light is higher than that when not being irradiated with ultraviolet light. Therefore, the adhesive force of the adhesive layer 212 after being irradiated with ultraviolet light is weakened, so that the devices 101 can be released onto the target substrate 300.

For example, the laser printer 400 includes a laser emitter and a beam expander (not shown in the figures). The laser emitted by the laser emitter is irradiated onto the spatial light modulation component 410 after being expanded, and the position and range of light emitted from the laser printer are modulated by the spatial light modulation component 410.

For example, the laser emitted by the laser emitter is ultraviolet pulse light with a wavelength of 365 nm-435 nm.

Figure 6B:
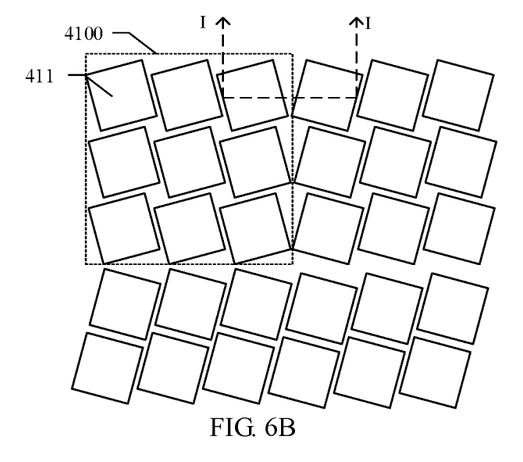
FIG. 6B is a schematic partial structural diagram of a digital micromirror device shown in FIG. 6A.

For example, the spatial light modulation component 410 includes a digital micromirror device (DMD). FIG. 6B is a schematic partial structural diagram of a digital micromirror device. As shown in FIG. 6B, the digital micromirror device includes a plurality of micromirrors 411, and each micromirror 411 has a size of 5.6 µm*5.6 µm-12 µm*12 in a plane parallel to the transfer substrate 210.

For example, the digital micromirror device can include 2560*1600 micromirrors 411, and each micromirror 411 can has a square shape and a size of 7.6 µm*7.6 µm.

For example, the digital micromirror device can be a combination of tens of thousands of tilted, microscopic lenses made of aluminum alloy, these lenses are fixed on hidden yokes, a torsional hinge structure is used to connect the yokes to a strut, and the torsional hinge structure allows the lenses to rotate by ±12 degrees. Each micromirror 411 can modulate the emitting position and range of the laser by being turned on or off. The hinge structure allows the lenses to tilt between two states, being "on" at +12 degrees and being "off" at −12 degrees. When the lenses are not in operation, they are in a "parked" state of 0 degree.

Figure 6C:
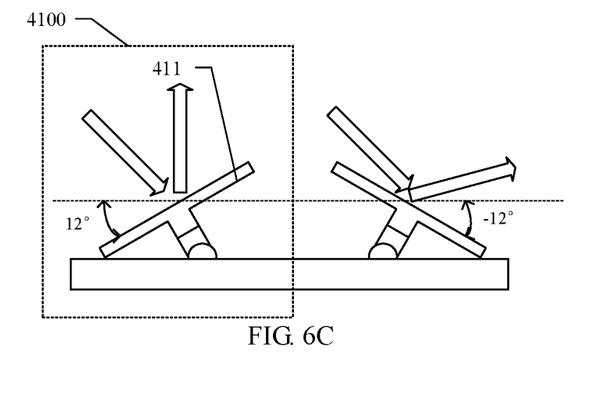
FIG. 6C is a schematic cross-sectional view of the digital micromirror device shown in FIG. 6B taken along line II.

For example, FIG. 6C is a schematic cross-sectional view of the digital micromirror device shown in FIG. 6B taken along line II. As shown in FIGS. 6B and 6C, an angle between a mirror surface of a micromirror 411 located in a light exiting region 4100 and a substrate of the micromirror is +12 degrees, and therefore, the micromirror 411 in the light exiting region 4100 is configured to reflect laser (the laser can exit in a direction perpendicular to the substrate of the micromirror) out of the laser printer 400. While the angle between a mirror surface of a micromirror 411 located in a region outside the light exiting region 4100 and a substrate of the micromirror is −12 degrees; the micromirror 411 in this region cannot reflect laser (the laser is reflected to other directions) out of the laser printer 400. In this way, a site-designated irradiation can be further realized by adjusting the direction in which the laser exits, through adjusting the angle of the micromirror.

Figure 6D:
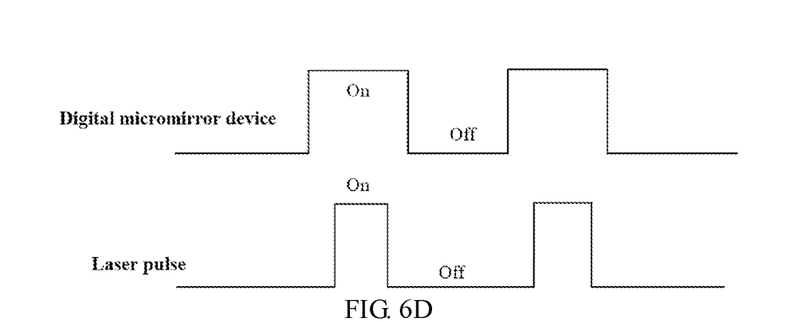
FIG. 6D is a timing diagram of a laser pulse and a digital micromirror device according to an embodiment of the present disclosure.

For example, FIG. 6D is a timing diagram of a laser pulse and a digital micromirror device. As shown in FIG. 6D, a turned-on time of a laser pulse of the laser printer 400 is within a turned-on time of the digital micromirror device 410. For example, after the micromirrors are controlled to be turned on by digital signals, the ultraviolet pulse laser is in an on state and emits laser, and the laser is reflected to the first transfer position of the transfer substrate through the micromirrors in an on state so as to realize a site-designated irradiation. The corresponding micromirrors are turned on before the laser pulse is turned on, thereby preventing the laser from irradiating to a position of the transfer substrate other than the first transfer position.

For example, the turned-on time of the digital micromirror device can be 80 µs-100 µs, and the turned-on time of the laser pulse can be 8 μs-50 μs. After the laser pulse is turned off, the digital signals control the micromirrors to be turned off, and the turned-off time of the micromirrors is within the turned-off time of the laser pulse.

For example, the transfer of the devices 101 can be realized by controlling the motion of the transfer substrate 210 and the target substrate 300 with respect to the laser printer 400 (the laser printer 400 is stationary). The present embodiment is not limited thereto, and the laser printer 400 can also be controlled to move relative to the transfer substrate 210.

For example, the number of laser printers 400 may be one or more.

For example, the light reflected by the digital micromirror device can irradiate the first transfer position on the transfer substrate 210 for multiple times, and the size of the light spot under accumulated irradiation should be greater than the size of the devices 101.

For example, a maximum size of the light spot irradiated on the transfer substrate 210 by the laser printer 400 may be 2 mm*3 mm, and a minimum size of the light spot may be 1.26 μm*1.26 μm. A scanning speed of the laser printer 400 relative to the target substrate 300 can reach 150 mm/s. Taking a spot size of 3 mm, a scanning speed of 150 mm/s and a size of each device 101 of 10 μm*10 μm as an example, during the process of transferring the devices 101, $4.5*10^7$ devices 101 can be transferred per second, thereby realizing a massive and rapid transfer.

Figure 7:
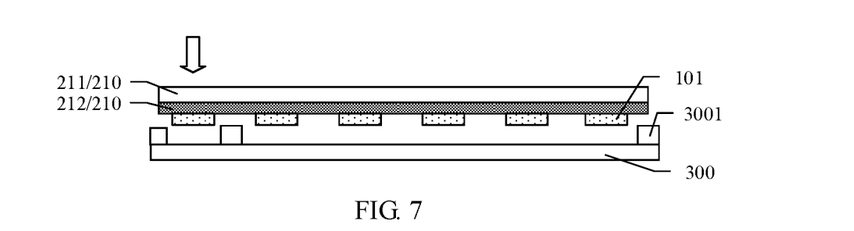
FIG. 7 is a schematic diagram of a transfer process of devices according to an embodiment of the disclosure.

For example, FIG. 7 is a schematic diagram of a transfer process of devices provided by the present embodiment. As shown in FIG. 7, a side of the target substrate 300 for placing the devices 101 is provided with a buffer layer 3001, and an orthographic projection of the buffer layer 3001 on the target substrate 300 is not overlapped with orthographic projections of devices 101 on the target substrate 300. After the transfer substrate 210 is aligned with the target substrate 300, the transfer substrate 210 is located above the target substrate 300, and the buffer layer 3001 is provided in a region of the target substrate 300 not used for placing the devices 101, thereby reducing the adhesion between the target substrate 300 and the transfer substrate 210 in the transfer process.

Figure 8A:
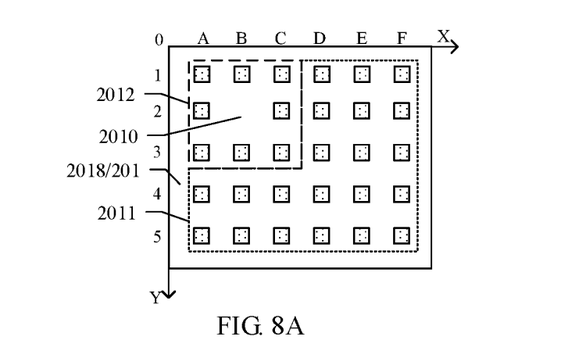
FIGS. 8A-8C are schematic diagrams of first position information, second position information and first target position information provided by another example of an embodiment of the disclosure, respectively.
Figure 8B:
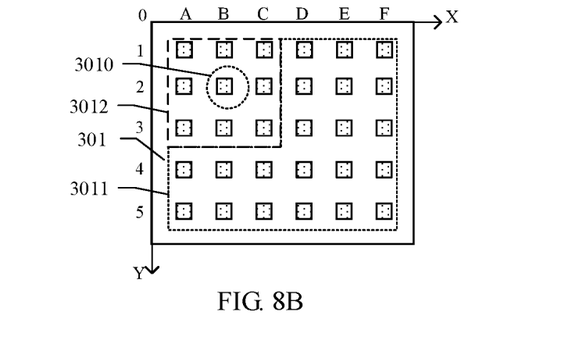
Figure 8C:
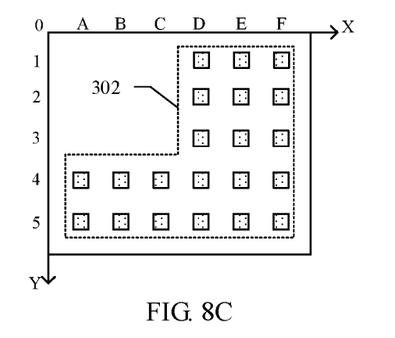

For example, FIGS. 8A-8C are schematic diagrams of first position information, second position information and first target position information provided by another example of an embodiment of the disclosure, respectively.

For example, as shown in FIGS. 1B and 8A-8C, the first position information 201 includes a plurality of sub-position information (FIG. 8A illustratively shows first sub-position information), that is, the first position information 201 is position information of all devices located on the transfer substrate, and the first sub-position information is position information corresponding to devices to be transferred to the target substrate, and therefore the transfer substrate can be used to transfer the same kind of devices for multiple times. But the present embodiment is not limited thereto, the same kind or different kinds of devices can be grown on different substrates and then be transferred to the target substrate through multiple transfer processes.

For example, as shown in FIG. 1B and FIGS. 8A-8C, comparing the first position information 201 with the second position information 301 to obtain the first target position information 302 can further include: if the first sub-position information 2018 includes only part of the positions recorded in the second position information 301, the first target position information 302 is at least part of the information in an overlap of the first sub-position information with the second position information 301. In this case, the first sub-position information and the second position information do not completely meet the position matching requirements. For a part on the transfer substrate that meets the position matching requirements, the next step of alignment can be performed, while for the other part on the transfer substrate that does not meet the position matching requirements, devices belonging thereto cannot be transferred through the transfer substrate; and it is necessary to compare sub-position information (e.g., second sub-position information mentioned below) located at other positions on the transfer substrate with the second position information.

For example, if the first sub-position information 2018 includes position information in the second position information 301 other than missing, position information 3010, the position information 3010 in the second position information 301 that is missed by the first sub-position information 2018 is defect position information 2010 missing from the first sub-position information 2018, and the defect position information 2010 is the coordinates of the defect positions of the devices 101 on the transfer substrate 210.

For example, in the case where the first target position information 302 is at least part of the information in the overlap of the first sub-position information 2018 with the second position information 301, the second position information 301 is divided into a first information region 3011 covered by the first sub-position information 2018 and a second information region 3012 including the position information 3010 missed by the first sub-position information 2018, and the first target position information 302 is position information of the first information region 3011. The coordinate position information of the devices to be transferred, on the transfer substrate corresponding to the first information region 3011 is located in a third information region 2011 of the first sub-position information 2018, and the coordinate position information, of the devices to be transferred, on the transfer substrate corresponding to the second information region 3012 is located in a fourth information region 2012 of the first sub-position information 2018.

For example, the first target position information 302 shown in FIG. 8C is inputted into the spatial light modulation component 410 shown in FIG. 6A, and the spatial light modulation component 410 modulates laser emitted from the laser printer 400 to irradiate, for example, all the devices on the position coordinates on the transfer substrate 210 only recorded in the third information region 2011 in a site-designated manner, thereby realizing a site-designated irradiation. In the embodiment of the present disclosure, after being turned on, the laser printer irradiates at least part of the devices located at the transfer positions on the transfer substrate at the same time. In the case where the number of devices to be transferred onto the target substrate is small, the laser pulse of the laser printer can be turned on once to complete the transfer of all the devices, thereby realizing accurate irradiation and saving process time.

In the example shown in FIGS. 8A-8C, when the first information region 3011 is taken as the first target position information, only the transfer of part of devices is completed. In fact, the actual coordinate positions of the devices to be transferred onto the target substrate should be as same as preset coordinate positions of the devices to be transferred recorded in the second position information; however, currently, the devices on the target substrate after the transfer according to the first target position information do not meet the device requirements, so devices need to be transferred, again, onto the positions, of the target substrate, where the missing devices are located, so as to ensure that the devices on the target substrate meet the device requirements.

Figure 9A:
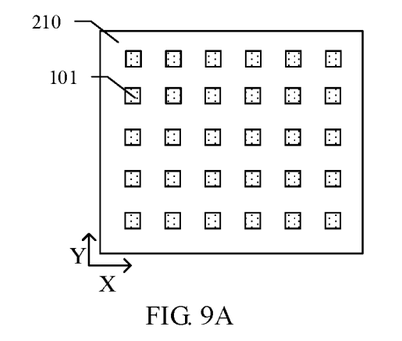
FIG. 9A is a schematic diagram of another part on a transfer substrate provided by an example of an embodiment of the disclosure.
Figure 9B:
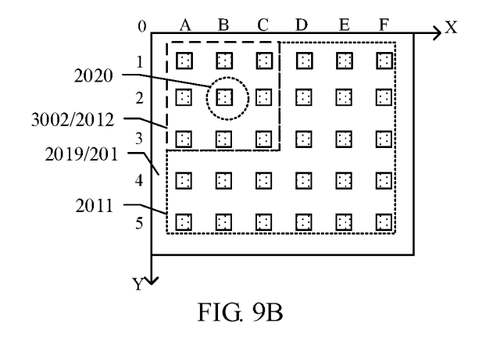
FIG. 9B is a schematic diagram of second sub-position information of devices on the transfer substrate shown in FIG. 9A.

FIG. 9A is a schematic diagram of another part on a transfer substrate provided by an example of the present embodiment, and FIG. 9B is a schematic diagram of second sub-position information of devices on the transfer substrate shown in FIG. 9A. FIG. 9B shows other sub-position information included in the first position information 201, such as second sub-position information 2019.

For example, FIG. 9A shows a region of another part on the transfer substrate 210 for transferring devices 101 to the target substrate.

For example, as shown in FIGS. 9B and 8B, information of the second sub-position information 2019 is compared with information of the second position information 301 to obtain second target position information 3002 recording a second transfer position. If the second sub-position information 2019 includes all positions recorded in the second information region 3012, the position information of the second information region 3012 is the second target position information 3002. That is, the second sub-position information 2019 is compared with the missing position information 3010 recorded in the second information region 3012, and if the second sub-position information 2019 includes the position information 3010 (corresponding to compensation position information 2020 in the second sub-position information 2019) missed by the first sub-position information 2018, the device positions on the transfer substrate 210 corresponding to the second sub-position information 2019 are aligned with the target substrate.

For example, according to the third information region 2011 and the fourth information region 2012 of the first position information 201, the second sub-position information 2019 can also be divided into a third information region 2011 and a fourth information region 2012, and the devices 101 on the position coordinates of the transfer substrate 210 recorded in the fourth information region 2012 can be transferred. The second sub-position information 2019 is also coordinate position information of devices, and the coordinate system of the second sub-position information is the same as the coordinate system of the first sub-position information. In both transfer processes, the origin of the coordinate system of the sub-position information is aligned with the origin of the coordinate system of the second information region. When the transfer substrate is aligned with the target substrate, an orthographic projection of the coordinate system of the transfer substrate on the target substrate coincides with the coordinate system of the target substrate; and when the transfer substrate is aligned with the target substrate, an orthographic projection of the coordinate system of the target substrate on the transfer substrate also coincides with the coordinate system of the transfer substrate.

Under the condition that the transfer substrate cannot transfer all the devices in a single time, devices in other regions of the transfer substrate can be used for a transfer of the remaining devices, so as to realize that the information of the positions of the devices on the target substrate finally meets the second position information, thereby meeting the device requirements.

For example, in an actual process, a plurality of identical, original substrates on which devices are formed can also be prepared before devices are transferred from an original substrate to a target substrate, and then the devices on the plurality of original substrates are transferred to a plurality of transfer substrates. When one transfer substrate is used to transfer the devices to one target substrate, the other transfer substrates serve as backup transfer substrates. When the one transfer substrate cannot complete the transfer of all devices, a backup transfer substrate can be used to complete the transfer of devices at the remaining, missing positions. In the present embodiment, a backup transfer substrate can also be used to realize that the information of the positions of the devices on the target substrate finally meets the second position information, so the missing positions on the target substrate can be compensated by a same transfer process.

Figure 10A:
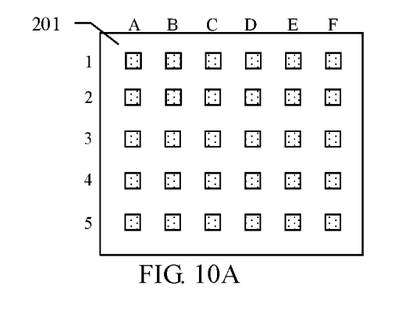
FIGS. 10A-10C are schematic diagrams of first position information and two pieces of second position information provided by another example of an embodiment of the disclosure, respectively.
Figure 10B:
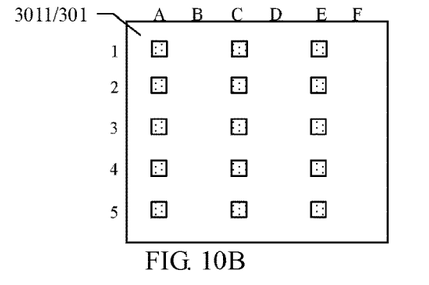
Figure 10C:
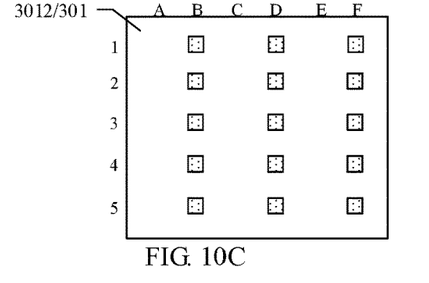

For example, FIGS. 10A-10C are schematic diagrams of first position information and two pieces of second position information provided by another example of the present embodiment, respectively. As shown in FIGS. 10A-10C, the first position information 201 includes all positions recorded in a plurality of second position information 301. For example, the first position information 201 includes all positions recorded in two pieces of second position information 3011 and 3012, and each piece of second position information 3011 and 3012 is first target position information, respectively. Thus, a same transfer substrate can be used to transfer devices to a plurality of target substrates. For example, the transfer substrate can be aligned with a plurality of target substrates, and then devices can be transferred onto the plurality of target substrates according to a plurality of first target position information.

Figure 11:
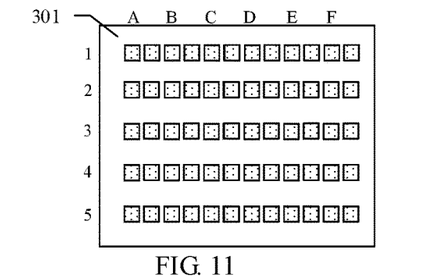
FIG. 11 is a schematic diagram of second position information provided by another example of an embodiment of the disclosure.

For example, FIG. 11 is a schematic diagram of second position information provided by another example of the present embodiment. As shown in FIGS. 10A and 11, in the case where the second position information 301 includes a plurality of first position information 201, for example, in the case where the second position information 301 includes all the position information of two pieces of first position information 201, two transfer substrates can be used to transfer devices onto a same target substrate; and in this case, the two transfer substrates are aligned with different positions of the same target substrate.

In the two examples shown in FIGS. 10A-11, the density of devices on the transfer substrate is not required to be the same as that of devices on the target substrate, and different density requirements of devices to be transferred onto the target substrate can be realized by adjusting the number of transfer substrates or by selectively transferring the devices on the transfer substrate to be transferred, thereby saving the cost.

Figure 12:
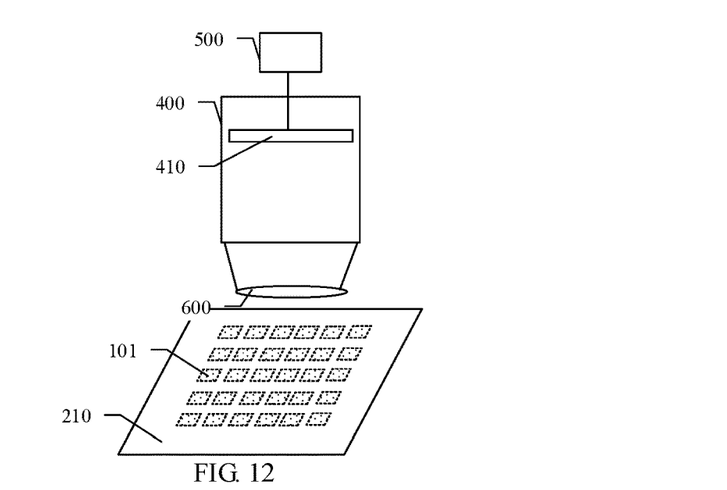
FIG. 12 is a schematic diagram of a transfer printing apparatus according to another embodiment of the present disclosure.

Another embodiment of the present disclosure provides a transfer printing apparatus, and FIG. 12 is a schematic diagram of the transfer apparatus provided by the present embodiment. As shown in FIG. 12, the transfer printing apparatus in the present embodiment includes: a transfer substrate 210, configured to transfer a plurality of devices 101 formed on an original substrate to a target substrate; a laser printer 400, including a spatial light modulation component 410 configured to modulate a laser printer 400 according to a comparison result of first position information of a plurality of devices 101 on the transfer substrate 210 and second position information on the target substrate for receiving devices 101 to be transferred, so that the laser printer 400 performs a site-designated laser irradiation on at least part of devices 101 on the transfer substrate 210, simultaneously. The process of transferring devices by using the transfer printing apparatus provided by the present embodiment is shown in FIG. 6A and details will not be repeated here.

For example, in one embodiment of the present disclosure, the laser printer can be used to simultaneously perform a site-designated laser irradiation on all devices on a transfer substrate, so that all devices can be transferred after one pulse is turned on.

For example, as shown in FIG. 12, the transfer printing apparatus provided by the present embodiment further includes: a data processor 500, electrically connected to the spatial light modulation component 410 and configured to compare the first position information with the second position information to obtain target position information to be transmitted to the spatial light modulation component 410; the spatial light modulation component 410 modulates the laser printer 400 according to the target position information, to perform the site-designated laser irradiation on the transfer position of the transfer substrate 210.

The obtaining processes of the first position information, the second position information and the target position information in the present embodiment are the same as the obtaining processes of the first position information, the second position information and the first target position information shown in FIGS. 5A-5C and FIGS. 8A-11, and details will not be repeated here.

For example, the spatial light modulation component 410 in the present embodiment is a digital micromirror device, the digital micromirror device includes a plurality of micromirrors 411 shown in FIG. 6B, each micromirror 411 has a size of 5.6 μm*5.6 μm-12 μm*12 μm in a plane parallel to the transfer substrate 210. For example, the digital micromirror device can include 2560*1600 micromirrors 411, and each micromirror 411 can have a square shape and a size of 7.6 μm*7.6 μm.

For example, the digital micromirror device can be a combination of tens of thousands of tilted microscopic lenses made of aluminum alloy, these lenses are fixed on hidden yokes, a torsional hinge structure is provided to connect the yokes to a strut, and the torsional hinge structure allows the lenses to rotate by ±12 degrees. Each micromirror 411 can modulate the emitting position and range of the laser by being turned on or off. The hinge structure allows the lenses to tilt between two states, being "on" at +12 degrees and being "off" at −12 degrees. When the lenses are not in operation, they are in a "parked" state of 0 degree.

For example, as shown in FIG. 6B, an angle between a mirror surface of a micromirror 411 located in a light exiting region 4100 and a substrate of the micromirror is +12 degrees, and therefore, the micromirror 411 in the light exiting region 4100 is configured to reflect laser out of the laser printer 400. While the angle between a mirror surface of a micromirror 411 located in a region outside the light exiting region 4100 and a substrate of the micromirror is −12 degrees, and the micromirror 411 in this region cannot reflect laser out of the laser printer 400. In this way, a site-designated irradiation can be further realized by adjusting the direction in which the laser exits, through adjusting the angle of the micromirror.

For example, a turned-on time of a laser pulse of the laser printer 400 is within a turned-on time of the digital micromirror device 410. For example, after the micromirrors are controlled to be turned on by digital signals, the ultraviolet pulse laser is in an on state and emits laser, and the laser is reflected to the transfer position of the transfer substrate through the micromirrors in an on state, so as to realize a site-designated irradiation. The corresponding micromirrors are turned on before the laser pulse is turned on, thereby preventing the laser from irradiating to a position of the transfer substrate other than the transfer position.

For example, the turned-on time of the digital micromirror device can be 80 μs-100 μs, and the turned-on time of the laser pulse can be 8 μs-50 μs. After the laser pulse is turned off, the digital signals control the micromirrors to be turned off, and the turned-off time of the micromirrors is within the turned-off time of the laser pulse.

For example, the number of the laser printer 400 may be one or more.

For example, the light reflected by the digital micromirror device can irradiate the first transfer position on the transfer substrate 210 for multiple times, and the size of the light spot under accumulated irradiation should be greater than the size of the devices 101.

For example, a maximum size of the light spot irradiated on the transfer substrate 210 by the laser printer 400 may be 2 mm*3 mm, and a minimum size of the light spot may be 1.26 μm*1.26 μm. A scanning speed of the laser printer 400 relative to the target substrate 300 can reach 150 mm/s. Taking a spot size of 3 mm, a scanning speed of 150 mm/s and a size of each device 101 of 10 μm*10 μm as an example, during the process of transferring the devices 101, $4.5*10^7$ devices 101 can be transferred per second, thereby realizing a massive and rapid transfer.

For example, as shown in FIG. 12, the transfer printing apparatus provided by the present embodiment further includes: a zoom lens 600, located on a side of the spatial light modulation component 410 facing the transfer substrate 210 and configured to adjust the size of a light spot emitted from the spatial light modulation component 410 to realize a site-designated laser irradiation. The zoom lens can adjust the size of the light spot irradiated on the transfer substrate by the laser printer. For example, the size of the light spot irradiated on the transfer substrate by the laser printer can be in a range of 1.26 μm*1.26 μm-2 mm*3 mm, but the present embodiment is not limited thereto.

FIG. 12 illustratively shows that the zoom lens is located on the side of the laser printer facing the transfer substrate, but the present embodiment is not limited thereto, and the zoom lens can also be located inside the laser printer and located on a light exiting side of the spatial light modulation component.

For example, the devices being transferred in the present embodiment can be micro LEDs, and a maximum size of each micro LED in a direction parallel to the transfer substrate is 5-20 μm.

By adopting the transfer printing apparatus provided by the present embodiment, a rapid transfer of devices in a large area can be realized, and the density of devices to be transferred on the target substrate can be adjusted as needed, so that for example, a high-density site-designated transfer can be realized, and the process cost is saved.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

What have been described above are only specific implementations of the present disclosure, the protection scope of the present disclosure is not limited thereto. Therefore, the protection scope of the present disclosure should be based on the protection scope of the claims.

What is claimed is:

1. A transfer printing method, comprising:
   transferring a plurality of devices formed on an original substrate to a transfer substrate;

obtaining first position information of positions of the plurality of devices on the transfer substrate;

obtaining second position information of corresponding positions, on a target substrate, of devices to be transferred;

comparing the first position information with the second position information to obtain first target position information recording a first transfer position; and aligning the transfer substrate with the target substrate, and performing a site-designated laser irradiation on at least part of devices on the transfer substrate corresponding to the first transfer position, simultaneously, according to the first target position information, so as to transfer the at least part of devices from the transfer substrate to the target substrate;

wherein the performing the site-designated laser irradiation comprises: inputting the first target position information into a laser printer having a spatial light modulation component, so that the spatial light modulation component modulates the laser printer to simultaneously perform laser irradiation on the at least part of devices on the transfer substrate corresponding to the first transfer position;

wherein a turned-on time of a laser pulse of the laser printer is within a turned-on time of the spatial light modulation component.

2. The transfer printing method according to claim 1, wherein the comparing the first position information with the second position information to obtain the first target position information comprises:

if the first position information comprises all positions recorded in the second position information, the first target position information is the second position information.

3. The transfer printing method according to claim 2, wherein the first position information comprises all positions recorded in a plurality of the second position information, a plurality of the first target position information is the plurality of the second position information, and the transfer substrate is configured to be aligned with a plurality of the target substrates, respectively, so that the devices on the transfer substrate are transferred to the plurality of the target substrates, respectively, according to the plurality of the first target position information.

4. The transfer printing method according to claim 1, wherein the first position information comprises a plurality of sub-position information, and the comparing the first position information with the second position information to obtain the first target position information comprises:

if first sub-position information of the plurality of sub-position information comprises only part of positions recorded in the second position information, the second position information is divided into a first information region covered by the first sub-position information and a second information region comprising position information missed by the first sub-position information, and the first target position information is position information of the first information region.

5. The transfer printing method according to claim 4, further comprising:

comparing second sub-position information of the plurality of sub-position information with position information of the second information region to obtain second target position information recording a second transfer position, wherein if the second sub-position information comprises all positions recorded in the second information region, the position information of the second information region is the second target position information; and performing a site-designated laser irradiation on at least part of devices on the transfer substrate corresponding to the second transfer position, simultaneously, according to the second target position information.

6. The transfer printing method according to claim 1, wherein the obtaining the first position information comprises: performing an optical scanning on the transfer substrate to obtain position information of the plurality of devices on the transfer substrate.

7. The transfer printing method according to claim 1, wherein the transfer substrate comprises a transparent material layer and an adhesive layer which are laminated, and the plurality of devices are located on a side of the adhesive layer away from the transparent material layer.

8. The transfer printing method according to claim 1, wherein a side of the target substrate on which the plurality of devices are arranged is provided with a buffer layer, and an orthographic projection of the buffer layer on the target substrate is not overlapped with orthographic projections of the plurality of devices on the target substrate.

9. The transfer printing method according to claim 1, wherein before forming the plurality of devices, the transfer printing method comprises: forming a sacrificial layer on the original substrate and patterning the sacrificial layer to form a plurality of sacrificial layer blocks spaced apart from each other; and the forming the plurality of devices comprises:

forming a material layer for forming the plurality of devices on a side of the plurality of sacrificial layer blocks away from the original substrate, the material layer comprising portions located on the plurality of sacrificial layer blocks and portions located at gaps between adjacent sacrificial layer blocks;

patterning the material layer to form the plurality of devices on the plurality of sacrificial layer blocks and to form connecting sections connecting every adjacent two devices, the connecting sections comprising portions on the plurality of sacrificial layer blocks and portions at the gaps between adjacent sacrificial layer blocks; and removing the sacrificial layer.

10. The transfer printing method according to claim 1, wherein forming the plurality of devices comprises: forming a sacrificial layer on the original substrate; and forming the plurality of devices on a side of the sacrificial layer away from the original substrate; and after forming the plurality of devices, the transfer printing method comprises: patterning the sacrificial layer, so that an orthographic projection of the sacrificial layer on the original substrate is completely within orthographic projections of the plurality of devices on the original substrate.

11. The transfer printing method according to claim 1, wherein the plurality of devices are micro LEDs, and a maximum size of each of the plurality of micro LEDs in a direction parallel to the original substrate is 5 µm-20 µm.

12. A transfer printing apparatus according to claim 1, comprising:

a transfer substrate, configured to transfer a plurality of devices formed on an original substrate to a target substrate; and a laser printer, comprising a spatial light modulation component configured to modulate the laser printer according to a comparison result between first position information of the plurality of devices on the transfer substrate and second position information on the target substrate configured to receive devices to be transferred, so that the laser printer performs a site-designated laser irradiation on at least part of devices on the transfer substrate, simultaneously;

wherein a turned-on time of a laser pulse of the laser printer is within a turned-on time of the spatial light modulation component.

13. The transfer printing apparatus according to claim 12, further comprising:

a data processor, electrically connected to the spatial light modulation component and configured to compare the first position information with the second position information to obtain target position information to be transmitted to the spatial light modulation component, wherein the spatial light modulation component modulates the laser printer according to the target position information, so as to perform the site-designated laser irradiation on the at least part of devices located at a transfer position on the transfer substrate, simultaneously.

14. The transfer printing apparatus according to claim 12, wherein the spatial light modulation component is a digital micromirror device.

15. The transfer printing apparatus according to claim 14, wherein the digital micromirror device comprises a plurality of micromirrors, and each of the plurality of micromirrors has a square shape and a size of 5.6 μm*5.6 μm-12 μm*12 μm in a plane parallel to the transfer substrate.

16. The transfer printing apparatus according to claim 12, further comprising: a zoom lens located on a side of the spatial light modulation component facing the transfer substrate.

17. A transfer printing method, comprising:

transferring a plurality of devices formed on an original substrate to a transfer substrate;

obtaining first position information of positions of the plurality of devices on the transfer substrate;

obtaining second position information of corresponding positions, on a target substrate, of devices to be transferred;

comparing the first position information with the second position information to obtain first target position information recording a first transfer position; and aligning the transfer substrate with the target substrate, and performing a site-designated laser irradiation on at least part of devices on the transfer substrate corresponding to the first transfer position, simultaneously, according to the first target position information, so as to transfer the at least part of devices from the transfer substrate to the target substrate;

wherein before forming the plurality of devices, the transfer printing method comprises: forming a sacrificial layer on the original substrate and patterning the sacrificial layer to form a plurality of sacrificial layer blocks spaced apart from each other; and the forming the plurality of devices comprises:

forming a material layer for forming the plurality of devices on a side of the plurality of sacrificial layer blocks away from the original substrate, the material layer comprising portions located on the plurality of sacrificial layer blocks and portions located at gaps between adjacent sacrificial layer blocks;

patterning the material layer to form the plurality of devices on the plurality of sacrificial layer blocks and to form connecting sections connecting every adjacent two devices, the connecting sections comprising portions on the plurality of sacrificial layer blocks and portions at the gaps between adjacent sacrificial layer blocks; and removing the sacrificial layer.

* * * * *